United States Patent
Radja et al.

(10) Patent No.: US 6,943,715 B2
(45) Date of Patent: Sep. 13, 2005

(54) BANDPASS SIGMA-DELTA ANALOG-TO-DIGITAL CONVERTER AND MASH-SIGMA-DELTA CONVERTER INCORPORATING SAME

(75) Inventors: Patrick Radja, Guyancourt (FR); Michel Robbe, Conflans-ste-Honorine (FR); Hervé Guegnaud, Maurepas (FR)

(73) Assignee: EADS Telecom, Montigny le Bretonneux (FR)

( * ) Notice: Subject to any disclaimer, the term of this patent is extended or adjusted under 35 U.S.C. 154(b) by 109 days.

(21) Appl. No.: 10/480,681

(22) PCT Filed: Jun. 4, 2002

(86) PCT No.: PCT/FR02/01882
§ 371 (c)(1),
(2), (4) Date: Dec. 12, 2003

(87) PCT Pub. No.: WO02/101932
PCT Pub. Date: Dec. 19, 2002

(65) Prior Publication Data
US 2004/0174285 A1 Sep. 9, 2004

(30) Foreign Application Priority Data
Jun. 13, 2001 (FR) .............................. 01 07744

(51) Int. Cl.$^7$ ................................................ H03M 3/00
(52) U.S. Cl. ........................................................ 341/143
(58) Field of Search ......................................... 341/143

(56) References Cited

U.S. PATENT DOCUMENTS

| | | | |
|---|---|---|---|
| 5,283,578 A | * | 2/1994 | Ribner et al. ................ 341/143 |
| 5,383,578 A | | 1/1995 | Nishimura |
| 5,500,645 A | * | 3/1996 | Ribner et al. ................ 341/143 |
| 5,982,315 A | * | 11/1999 | Bazarjani et al. ........... 341/143 |
| 6,061,008 A | | 5/2000 | Abbey |
| 6,121,910 A | * | 9/2000 | Khoury et al. .............. 341/143 |

OTHER PUBLICATIONS

International Search Report PCT/FR02/01882 dated Sep. 6, 2002.

* cited by examiner

Primary Examiner—Howard L. Williams
(74) Attorney, Agent, or Firm—McCracken & Frank LLP

(57) ABSTRACT

The invention concerns a passband Sigma-Delta analog-to-digital converter comprising a first resonator and a second order second resonator, preferably of second order, whereof the respective central frequencies enable a high SNR in a relatively wide frequency band, and a MASH Sigma-Delta analog-to-digital converter incorporating at least two such cascaded converters.

10 Claims, 5 Drawing Sheets

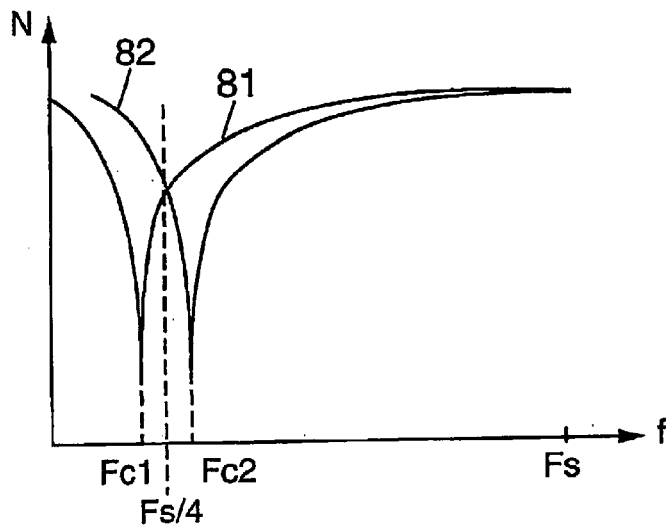
FIG. 8
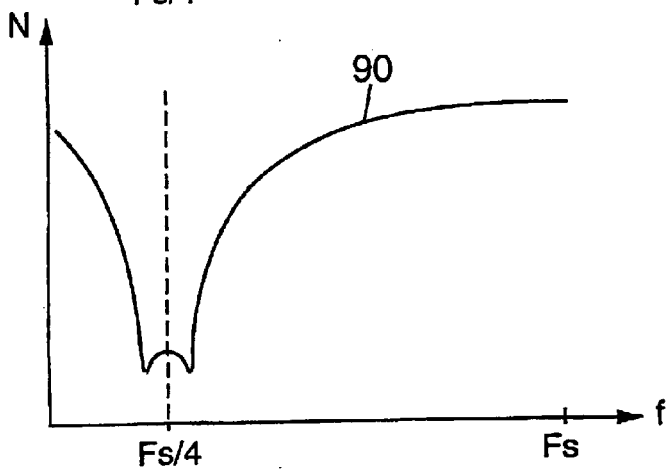
FIG. 9
| t = t0 | t = to+ Ts | t = to + 2xTs | t = to + 3xTS |
|---|---|---|---|
| C0 <- In0 | C0 <- In14 | C0 <- In15 | C0 <- In7 |
| C1 <- In1 | C1 <- In1 | C1 <- In13 | C1 <- In0 |
| C2 <- In2 | C2 <- In12 | C2 <- In11 | C2 <- In6 |
| C3 <- In3 | C3 <- In3 | C3 <- In9 | C3 <- In3 |
| C4 <- In4 | C4 <- In10 | C4 <- In7 | C4 <- In15 |
| C5 <- In5 | C5 <- In5 | C5 <- In5 | C5 <- In14 |
| C6 <- In6 | C6 <- In8 | C6 <- In3 | C6 <- In8 |
| C7 <- In7 | C7 <- In7 | C7 <- In1 | C7 <- In9 |
| C8 <- In8 | C8 <- In6 | C8 <- In0 | C8 <- In10 |
| C9 <- In9 | C9 <- In9 | C9 <- In2 | C9 <- In0 |
| C10 <- In10 | C10 <- In4 | C10 <- In4 | C10 <- In5 |
| C11 <- In11 | C11 <- In11 | C11 <- In6 | C11 <- In1 |
| C12 <- In12 | C12 <- In2 | C12 <- In8 | C12 <- In2 |
| C13 <- In13 | C13 <- In13 | C13 <- In10 | C13 <- In12 |
| C14 <- In14 | C14 <- In0 | C14 <- In12 | C14 <- In4 |
| C15 <- In15 | C15 <- In15 | C15 <- In14 | C15 <- In11 |
FIG. 12

| 13.0 | 11.0 | 7.0 | 3.0 | 13.1 | 11.1 | 7.1 | 3.1 | 13.2 | 11.2 | 7.2 | 3.2 | 13.3 | 11.3 | 7.3 | 3.3 |
|---|---|---|---|---|---|---|---|---|---|---|---|---|---|---|---|
| 9.0 | 1.0 | 15.0 | 5.0 | 9.1 | 1.1 | 15.1 | 5.1 | 9.2 | 1.2 | 15.2 | 5.2 | 9.3 | 1.3 | 15.3 | 5.3 |
| 4.0 | 14.0 | 0.0 | 8.0 | 4.1 | 14.1 | 0.1 | 8.1 | 4.2 | 14.2 | 0.2 | 8.2 | 4.3 | 14.3 | 0.3 | 8.3 |
| 2.0 | 6.0 | 10.0 | 12.0 | 2.1 | 6.1 | 10.1 | 12.1 | 2.2 | 6.2 | 10.2 | 12.2 | 2.3 | 6.3 | 10.3 | 12.3 |
| 13.4 | 11.4 | 7.4 | 3.4 | 13.5 | 11.5 | 7.5 | 3.5 | 13.6 | 11.6 | 7.6 | 3.6 | 13.7 | 11.7 | 7.7 | 3.7 |
| 9.4 | 1.4 | 15.4 | 5.4 | 9.5 | 1.5 | 15.5 | 5.5 | 9.6 | 1.6 | 15.6 | 5.6 | 9.7 | 1.7 | 15.7 | 5.7 |
| 4.4 | 14.4 | 0.4 | 8.4 | 4.5 | 14.5 | 0.5 | 8.5 | 4.6 | 14.6 | 0.6 | 8.6 | 4.7 | 14.7 | 0.7 | 8.7 |
| 2.4 | 6.4 | 10.4 | 12.4 | 2.5 | 6.5 | 10.5 | 12.5 | 2.6 | 6.6 | 10.6 | 12.6 | 2.7 | 6.7 | 10.7 | 12.7 |
| 13.8 | 11.8 | 7.8 | 3.8 | 13.9 | 11.9 | 7.9 | 3.9 | 13.10 | 11.10 | 7.10 | 3.10 | 13.11 | 11.11 | 7.11 | 3.11 |
| 9.8 | 1.8 | 15.8 | 5.8 | 9.9 | 1.9 | 15.9 | 5.9 | 9.10 | 1.10 | 15.10 | 5.10 | 9.11 | 1.11 | 15.11 | 5.11 |
| 4.8 | 14.8 | 0.8 | 8.8 | 4.9 | 14.9 | 0.9 | 8.9 | 4.10 | 14.10 | 0.10 | 8.10 | 4.11 | 14.11 | 0.11 | 8.11 |
| 2.8 | 6.8 | 10.8 | 12.8 | 2.9 | 6.9 | 10.9 | 12.9 | 2.10 | 6.10 | 10.10 | 12.10 | 2.11 | 6.11 | 10.11 | 12.11 |
| 13.12 | 11.12 | 7.12 | 3.12 | 13.13 | 11.13 | 7.13 | 3.13 | 13.14 | 11.14 | 7.14 | 3.14 | 13.15 | 11.15 | 7.15 | 3.15 |
| 9.12 | 1.12 | 15.12 | 5.12 | 9.13 | 1.13 | 15.13 | 5.13 | 9.14 | 1.14 | 15.14 | 5.14 | 9.15 | 1.15 | 15.15 | 5.15 |
| 4.12 | 14.12 | 0.12 | 8.12 | 4.13 | 14.13 | 0.13 | 8.13 | 4.14 | 14.14 | 0.14 | 8.14 | 4.15 | 14.15 | 0.15 | 8.15 |
| 2.12 | 6.12 | 10.12 | 12.12 | 2.13 | 6.13 | 10.13 | 12.13 | 2.14 | 6.14 | 10.14 | 12.14 | 2.15 | 6.15 | 10.15 | 12.15 |

US 6,943,715 B2

BANDPASS SIGMA-DELTA ANALOG-TO-DIGITAL CONVERTER AND MASH-SIGMA-DELTA CONVERTER INCORPORATING SAME

TECHNICAL FIELD

The present invention relates to a bandpass Sigma-Delta analog-to-digital converter, and a MASH Sigma-Delta converter incorporating same.

It relates to the field of analog-to-digital conversion, and in particular to oversampled or overclocked analog-to-digital converters, more commonly known as Sigma-Delta converters (or $\Sigma$-$\Delta$ converters).

BACKGROUND OF THE INVENTION

The invention has applications in radio-frequency receivers, in particular mobile stations or fixed stations of a radiocommunication system, for example a Private Mobile Radiocommunication (PMR) system. In such an application, the signal to be converted is for example a signal containing 20 or so channels each having a bandwidth of about 12 kHz (kilohertz), that is a signal occupying a frequency band of total bandwidth of about 200 kHz.

Sigma-Delta converters are very widely used in the field of analog-to-digital conversion because of their high resolution (quantization is typically carried out on 16 bits, and even on 17 or 18 bits in some cases). This high resolution is achieved by having a sampling frequency that is high compared with the band of the converted signal (typically, the sampling frequency is around 1 megahertz or around 10 megahertz), which does not constitute a drawback in a radio-frequency system.

The principle of a Sigma-Delta modulator is illustrated by the diagram of FIG. 1. This figure represents a low-pass Sigma-Delta modulator 100 through which an analog input signal's samples x(nT), obtained at a determined sampling frequency denoted Fs from now on, can be converted to values y(nT) of a digital output signal encoded on n bits, where n is an integer.

The converter 100 includes an analog subtractor 11 the positive input of which receives the samples x(nT), and the negative input of which receives the samples x'(nT) of an analog feedback signal. The output of the subtractor 11 is used as input to a filter 12, the output of which is connected to the input of an analog-to-digital converter 10, from now on referred to as ADC. A feedback loop includes a digital-to-analog converter 20, from now on referred to as DAC, which receives at its input the values y(nT) of the digital output signal and converts them in order to deliver the samples x'(nT) of the abovementioned analog feedback signal.

In a low-pass Sigma-Delta analog-to-digital converter, which is suitable for the analog-to-digital conversion of a baseband signal, the filter 12 is a low-pass filter. The latter performs noise shaping, enabling quantization noise to be rejected in the higher frequencies.

Noise shaping by a first-order low-pass filter is illustrated by the graph of FIG. 2. This figure represents the energy density N of the quantization noise as a function of frequency f, for values of f between 0 and Fs. The higher the order of the filter, the greater the energy density rejected in the higher frequencies.

Thus connected, the ADC converts not the samples x(nT) of the input signal directly but the difference between these samples x(nT) and samples x'(nT) of the analog feedback signal, after noise shaping by the filter 12.

The quantization noise is then eliminated by digital post-processing by means of a decimation filter (not represented) receiving at its input the values y(nT) of the digital output signal encoded on n bits, and delivering at its output digital values encoded on n+m bits where m is also an integer. The post-processing by the decimation filter brings about a low-pass filtering in order to attenuate the energy of the signal outside the useful band. It also has the function of bringing the sampling frequency back to the Nyquist frequency, for example by performing an average over several consecutive values of the output signal y(nT). For a low-pass Sigma-Delta analog-to-digital converter, the noise shaping function corresponds to the inverse of a sine cardinal function ("sinc" function), such that the transfer function of the decimation filter is a sinc function which is easy to realize.

If the converter is produced using CMOS technology components, which generate noise at a frequency of zero (DC frequency), it is preferable not to perform the conversion of the baseband signal. The signal is converted after frequency translation to a frequency band of between, for example, 400 kHz and 600 kHz. The signal to be converted is then centered on a center frequency Fo, equal to 500 kHz in this example. Noise shaping by the low-pass filter of the converter then becomes a drawback, since the energy density of the quantization noise at the frequency Fo may be high, which significantly degrades the signal-to-noise ratio (SNR).

This is why there is a need for bandpass Sigma-Delta analog-to-digital converters.

The principle of a bandpass Sigma-Delta converter 200 is illustrated by the diagram of FIG. 3, in which the same items as in FIG. 1 bear the same references. Substantially, this principle is similar to that of the low-pass Sigma-Delta converter 100, the noise-shaping low-pass filter 12 of the latter (FIG. 1) being replaced however with a resonator 13. It is recalled that a resonator is a bandpass filtering cell having infinite gain at a determined frequency (corresponding to a pole of the transfer function) called the center frequency of the resonator. The center frequency of the resonator 13 is set to the center frequency Fo of the frequency band of the signal to be converted.

Noise shaping by a first-order resonator is illustrated by the graph of FIG. 4, to be compared with that of FIG. 2. As can be seen in this figure, the quantization noise is rejected on either side of the center frequency Fo. The higher the order of the filter, the greater the quantization noise energy density thus rejected.

In practice, the center frequency Fo of the band of the signal to be converted is set up to be Fs/4, in which case one refers to the "Fs/4 mode" of the converter. The return to baseband at the output of the converter (upstream of the decimation filter) is then provided by simple digital calculation operations, since it is a matter of multiplying by the four values 1, 0, −1 and 0.

Examples of such converters are proposed for example in reference U.S. Pat. No. 5,383,578. In this document, implementations are proposed in which the converter includes two first- or second-order resonators in series, each having their center frequency set to the center frequency Fo of the frequency band of the signal to be converted.

An important parameter of a bandpass Sigma-Delta converter is the width of the frequency band around the center frequency of the resonator, outside of which the quantization noise is rejected. This parameter is important because it directly affects the SNR. The greater the width, the better the SNR.

In the prior art, there are two techniques currently known for increasing the width of this band:

- either the sampling frequency Fs is increased, by arranging, for example, for the center frequency Fo of the band of the signal to be converted to be equal to Fs/8 (in which case one refers to the "Fs/8 mode" of the converter); this amounts to increasing the OverSampling Ratio (OSR), but in that case there are restrictions due to the characteristics of the amplifier used to produce the converter;
- or the order of the converter is increased, which requires the use of particular structures, the most current of which is the MASH type cascaded structure (see "Oversampling Delta-Sigma Data Converters—Theory, Design and Simulation", Candy et al., IEEE Press, 1992), in order to work around the stability problems; examples of converters thus having several cascaded stages (called "MASH Sigma-Delta converters") are shown for example in the abovementioned U.S. Pat. No. 5,383,578.

SUMMARY OF THE INVENTION

The invention thus proposes a bandpass Sigma-Delta analog-to-digital converter including:.

- a first analog adder receiving at a first input the samples of an analog input signal to be converted, and the samples of a first analog feedback signal at a second input;
- a first second-order resonator, the center frequency of which is adjustable, receiving as input the samples delivered by the output of the first analog adder;
- a second analog adder receiving at a first input the samples delivered by the output of the first resonator, the samples of a second analog feedback signal at a second input, and additionally the samples of the analog input signal to be converted at a third input;
- a second second-order resonator, the center frequency of which is adjustable, receiving as input the samples delivered by the output of the second analog adder;
- an analog-to-digital converter receiving as input the samples delivered by the output of the second resonator and delivering as output the values of a digital output signal corresponding to the converted analog input signal;
- a first feedback loop that includes a digital-to-analog converter receiving as input the values of the digital output signal, and which delivers the samples of the first analog feedback signal; and,
- a second feedback loop that includes said digital-to-analog converter and that delivers the samples of the second analog feedback signal.

The fact that the resonators have an adjustable center frequency means that the width of the frequency band outside of which the quantization noise is rejected can be increased.

Indeed, by setting the center frequency of the first resonator to a value that is slightly less than or greater than the center frequency of the frequency band of the analog input signal to be converted, and by setting the center frequency of the second resonator to a value that is respectively slightly greater than or slightly less than the center frequency band of the frequency band of the analog input signal to be converted, a high SNR can be achieved in a relatively wide frequency band, of about 200 kHz.

The invention also relates to a MASH type Sigma-Delta analog-to-digital converter, including at least a first and a second bandpass Sigma-Delta analog-to-digital converter that are cascaded, and a recombination filter receiving the output signal of the first converter at a first input and the output signal of the second converter at a second input, in which MASH type Sigma-Delta analog-to-digital converter the first and/or the second converters are bandpass Sigma-Delta analog-to-digital converters as defined above.

The advantage of the MASH Sigma-Delta analog-to-digital converter of the invention lies in the fact that an eighth-order converter of this type is obtained with only two stages, thus reducing the space occupied by the converter on a silicon substrate.

Other features and advantages of the invention will become more apparent on reading the description that follows. This description is purely illustrative and must be read with reference to the accompanying drawings in which:

BRIEF DESCRIPTION OF THE DRAWINGS

FIG. 8 and FIG. 9 are graphs illustrating the noise shaping by a Sigma-Delta converter according to the invention;

FIG. 12 is a table illustrating the control of 16 individual current sources included in the composition of a 4-bit DAC, with pseudo-random interleaving of these sources;

FIG. 5 is a schematic representation of a bandpass Sigma-Delta analog-to-digital converter 300 according to the invention.

Figure 1:
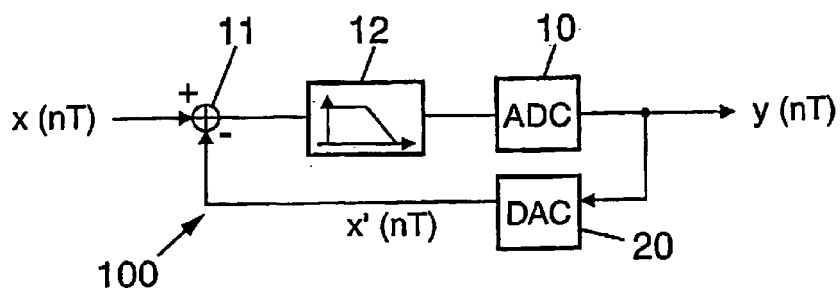
FIG. 1, already analyzed, is a diagram illustrating the principle of a low-pass Sigma-Delta converter.
Figure 2:
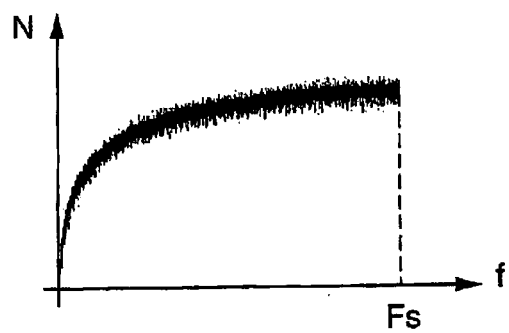
FIG. 2, also already analyzed, is a graph representing the noise shaping by the converter of FIG. 1.
Figure 3:
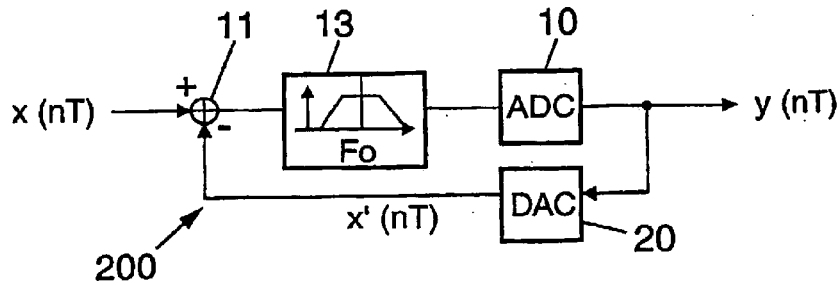
FIG. 3, also already analyzed, is a diagram illustrating the principle of a bandpass Sigma-Delta converter.
Figure 4:
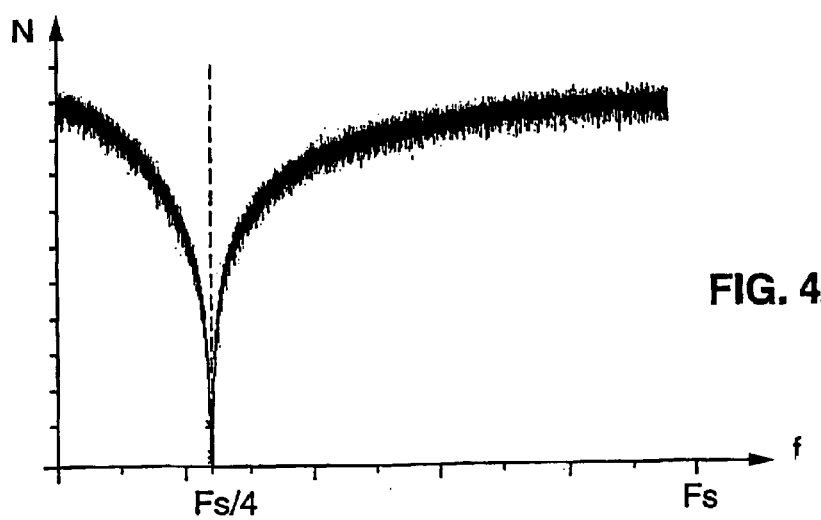
FIG. 4, also already analyzed, is a graph illustrating the noise shaping by the converter of FIG. 3.

This converter 300 includes a first analog adder S1. The latter receives, at its first input, via a scaling circuit 53 having a gain J3 that is positive, the samples x(nT) of the analog input signal x to be converted. It also receives, at a second input, the samples x1'(nT) of a first analog feedback signal x1'.

The converter 300 also includes a first resonator 101, preferably of second order. The center frequency of the resonator 101 is adjustable. The resonator 101 receives at its input the samples delivered by the output of the analog adder S1, corresponding to the analog sum of the samples x1'(nT) and samples x(nT) affected by the gain J3 of the scaling circuit 53. It delivers as output samples j(nT) of a signal j corresponding to the analog signal received as input after bandpass filtering.

The converter 300 further includes a second analog adder S2. The latter receives, at a first input, the samples j(nT) delivered by the output of the resonator 101. It also receives, at a second input, the samples x2'(nT) of a second analog feedback signal x2'. As a preference, it also receives, at a third input, via another scaling circuit 54 having a gain J4 that is positive, the samples x(nT) of the analog input signal x.

The converter 300 also includes a second resonator 102, preferably also of second order, the center frequency of which is also adjustable. The latter receives as input the samples of the analog signal delivered by the output of the second analog adder S2, corresponding to the analog sum of the samples j(nT) and x2'(nT) and additionally samples x(nT) affected by the gain J4 of the scaling circuit 54. It delivers at its output the samples k(nT) of an analog signal k corresponding to the analog signal received as input after bandpass filtering. From now on, the signal k delivered as output of the resonator 102 is called bandpass filtered analog signal. The bandpass filtering order to which reference is thus made, is, in the example described, a fourth-order filtering resulting from the second-order filtering by each of the resonators 101 and 102.

The converter 300 also includes an analog-to-digital converter 103 with n output bits, where n is an integer strictly greater than one. As a preference, n is equal to sixteen (n=16). The ADC 103 receives at its input the samples k(nT) of the bandpass filtered analog signal k, delivered by the output of the second resonator 102. It delivers at its output values y(nT) of a digital signal, y corresponding to the converted analog input signal x.

The converter 300 also includes a first feedback loop 111 which includes a digital-to-analog converter 104 with n input bits. The DAC 104 receives at its input the values y(nT) of the digital output signal y, and delivers as output the samples x'(nT) of an analog signal x' corresponding to the converted output signal y. The feedback loop 111 also includes a scaling circuit 51, receiving the samples x'(nT) at its input and delivering as output the samples x1'(nT) of the abovementioned first analog feedback signal x1'. The gain J1 of the scaling circuit 51 is negative in order to achieve the feedback sought.

The converter 300 lastly includes a second feedback loop 112, which includes the DAC 104 and another scaling circuit 52, receiving the samples x'(nT) at its input and delivering as output samples x2'(nT) of the abovementioned second analog feedback signal x2'. The gain J2 of the circuit 52 is also negative, in order to achieve the feedback sought.

In one example, the analog signal to be converted has a frequency band of about 200 kHz wide, corresponding to 20 channels of about 12 kHz width each. This band is translated to a center frequency Fo approximately equal to 1.2 MHz. As a preference, the sampling frequency Fs of the analog input signal x to be converted is such that Fo is equal to a quarter of Fs (Fo=Fs/4). This simplifies the return to baseband of the digital output signal (that is, after analog-to-digital conversion) In the example, Fs is therefore equal to 4.8 MHz.

From now on, the transfer functions of the first resonator 101 and of the second resonator 102 are denoted H1(z) and H2(z) respectively, where z denotes the discrete-time frequency variable. In addition, θ1 and θ2 are used to denote the argument of the variable z for the transfer function H1(z) and for the transfer function H2(z), respectively. It is recalled that the argument θ of the variable z is such that θ=2.π.f/Fs, where f denotes the frequency.

By making use of these notations, and additionally using "cos" to denote the cosine function, the transfer function H1(z) of the resonator 101 is preferably given by the following relationship:

$$H1(z) = \frac{(\cos\theta 1 \times z^{-1}) - z^{-2}}{1 - (2 \times \cos\theta 1 \times z^{-1}) + z^{-2}} \quad (1)$$

and the transfer function H2(z) of the second resonator 102 is preferably given by the following relationship:

$$H2(z) = \frac{(\cos\theta 2 \times z^{-1}) - z^{-2}}{1 - (2 \times \cos\theta 2 \times z^{-1}) + z^{-2}} \quad (2)$$

Therefore, bi-quadratic functions are involved, that is to say ones that are quadratic in the numerator and in the denominator.

Preferably, the resonator 101 and the resonator 102 are of identical structure, that is to say that their respective transfer functions are implemented by identical electronic components. This simplifies the design, test and fabrication of the converter on a silicon substrate. In this case, the resonator 101 and the resonator 102 are second-order analog filters. As a preference, they have a switched-capacitor structure, with adjustment of the parameter cos θ1 or cos θ2, respectively, via a respective variable capacitor. "Switched capacitor" is understood to mean a capacitor having an upstream series switch ISAM and a downstream series switch ISAV, in series with each of its terminals respectively, and in addition an upstream parallel switch IPAM and a downstream parallel switch IPAV, in parallel with each of its terminals respectively (see, for example the switched capacitor C01 in the diagram of FIG. 6). Unless otherwise indicated, the free terminal of the parallel switches IPAM and IPAV of each switched capacitor to which reference is made from now on, is connected to ground. Switched-capacitor filters are well known to the person skilled in the art and particular comments concerning them need not be made here.

Figure 6:
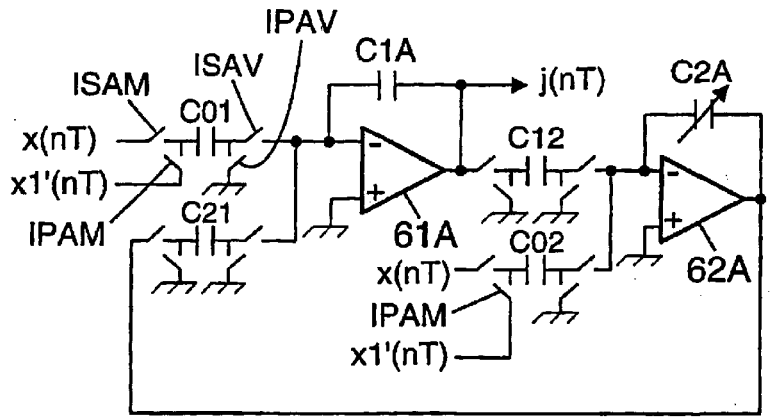
FIG. 6 and FIG. 7 are circuit diagrams for producing resonators of the Sigma-Delta converter according to one advantageous embodiment of the invention.

FIG. 6 schematically represents one possible embodiment of the resonator 101, additionally including the adder S1 in the particular case where J1=−J3 and/or J2=−(J4+1).

The resonator 101, which in this case has a switched-capacitor structure, includes two integrator stages. Each of these stages includes an operational amplifier 61A and 62A respectively, in series via a switched capacitor C12. The output of the resonator 101 is taken at the output of the amplifier 61A which therefore delivers the analog signal j. The non-inverting inputs of the amplifiers 61A and 62A are connected to ground. The output of the amplifier 61A is connected to its inverting input via a capacitor C1A. In addition, the output of the amplifier 62A is connected to its inverting input via a variable capacitor C2A, enabling the abovementioned parameter cos θ1 to be adjusted. Furthermore, the inverting input of the amplifier 61A receives the analog input signal x (multiplied by the gain J3 of the scaling circuit 53) via a switched capacitor C01. The first feedback signal x1' is conveyed to the free terminal of the upstream parallel switch IPAM of the switched capacitor C01, the latter not being connected to ground. The switched capacitor C01, thus connected, forms the analog adder S1. In addition, the inverting input of the amplifier 61A is connected to the output of the amplifier 62A via a switched capacitor C21. Lastly, the inverting input of the amplifier 62A receives the analog input signal x (multiplied by the gain J3 of the scaling circuit 53) via another switched capacitor C02. The first feedback signal x1' is conveyed to the free terminal of the upstream parallel switch IPAM of the switched capacitor C02, the latter not being connected to ground.

If additionally the following relationships are specified:

C01=I01×C1A;
C21=S21×C1A;
C12=I12×C2A; and
C02=I02×C2A, where I01, S21, I12 and I02 are appropriate parameters, then it can be shown that the transfer function H1(z) of the resonator 101 is given by the following relationship:

$$H1(z) = \frac{(I01 - I02 \times S21) \times z^{-1} - I01 \times z^{-2}}{1 - (2 - I12 \times S21) \times z^{-1} + z^{-2}} \quad (3)$$

If in addition, provision is made for I01=S21=1, then relationship (3) becomes identified with relationship (1) above, by additionally setting I02=(1−cos θ1) and I12=2×(1−cos θ1).

Figure 7:
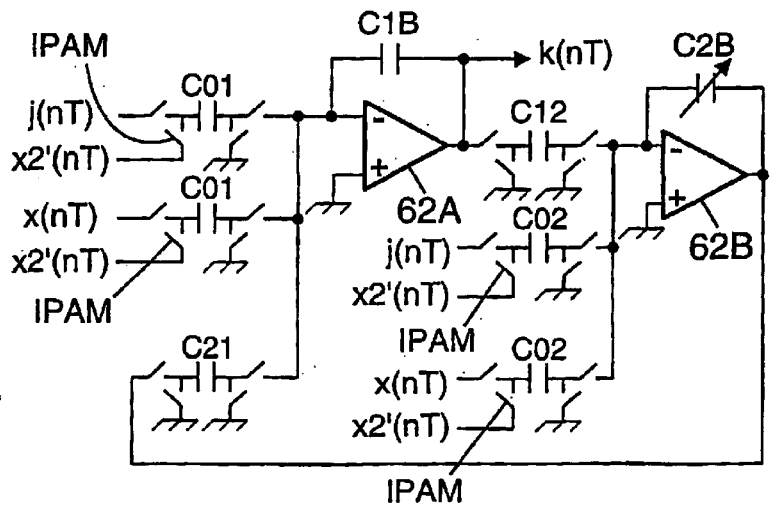

FIG. 7 schematically shows one possible embodiment of the resonator 102, additionally including the adder S2.

The resonator 102, which in this case also has a switched-capacitor structure, includes two integrator stages. Each of these stages includes an operational amplifier 61B and 62B respectively, in series via a switched capacitor C12. The output of the resonator 102 is taken at the output of the amplifier 61B, which delivers the bandpass filtered analog signal k. The non-inverting inputs of the amplifiers 61B and 62B are connected to ground. The output of the amplifier 61B is connected to its inverting input via a capacitor C1B. In addition, the output of the amplifier 62B is connected to its inverting input via a variable capacitor C2B, enabling the abovementioned parameter cos θ2 to be adjusted. Furthermore, the inverting input of the amplifier 61B receives, first the analog signal j via a switched capacitor C01, and secondly the analog input signal x (multiplied by the gain J4 of the scaling circuit 54) via another switched capacitor C01. The second feedback signal x2' is conveyed to the free terminal of the upstream parallel switch IPAM of each of the two abovementioned switched capacitors C01, these not being connected to ground. The switched capacitors C01 thus connected, form the analog adder S2. In addition, the inverting input of the amplifier 61B is connected to the output of the amplifier 62B via a switched capacitor C21. Lastly, the inverting input of the amplifier 62B additionally receives, first the analog signal j via a switched capacitor C02, and secondly the analog input signal x (multiplied by the gain J4 of the scaling circuit 54) via another switched capacitor C02. The second feedback signal x2' is conveyed to the free terminal of the upstream parallel switch IPAM of each of the two abovementioned switched capacitors C02, these not being connected to ground.

If in addition the following relationships are specified:

C01=I01×C1B;
C21=S21×C1B;
C12=I12×C2B; and
C02=I02×C2A, where I01, S21, I12 and I02 are the appropriate abovementioned parameters, then it can be shown that the transfer function H2(z) of the resonator 102 is given by the following relationship:

$$H2(z) = \frac{(I01 - I02 \times S21) \times z^{-1} - I01 \times z^{-2}}{1 - (2 - I12 \times S21) \times z^{-1} + z^{-2}} \quad (4)$$

If in addition, provision is made for I01=S21=1, then relationship (4) becomes identified to the above relationship (2), by additionally setting. I02=(1−cos θ2) and I12=2×(1−cos θ2).

The values of capacitors C2A and C2B are adjustable, and it is using these that values of the parameters cos θ1 and cos θ2 respectively can be adjusted, which parameters determine the exact position of the poles of the transfer functions H1(z) and H2(z) respectively. These capacitors can therefore be used to control the operating mode of the resonators 101 and 102 respectively (operating in Fs/4 mode or in Fs/8 mode, for example) and the setting of their center frequencies.

In particular, if cos θ1=cos θ2=0, the center frequency Fc1 and the center frequency Fc2 of the resonators 101 and 102 respectively are equal to a quarter of the sampling frequency (Fc1=Fc2=Fs/4) This then is the Fs/4 mode. Likewise, if cos θ1=cos θ2=+√2/2, the center frequencies Fc1 and Fc2 of the resonators 101 and 102 respectively are equal to an eighth of the sampling frequency (Fc1=Fc2=Fs/8) This then is the Fs/8 mode.

According to one advantageous embodiment, the center frequency Fc1 of the resonator 101 is slightly less than (respectively greater than) the center frequency Fo of the frequency band of the analog input signal x to be converted, and the center frequency Fc1 of the resonator 102 is slightly greater than (respectively less than) this center frequency Fo.

This setting is illustrated by the graphs of FIGS. 8 and 9, in one preferred embodiment in which the center frequency Fo of the frequency band of the analog signal x to be converted is equal to a quarter of the sampling frequency Fs (Fo=Fs/4). In FIG. 8, the curve 81 gives for example the noise shaping characteristic of the resonator 101, and the curve 82 gives the noise shaping characteristic of the resonator 102. In FIG. 9, the curve 90 gives the noise shaping characteristic of the bandpass Sigma-Delta converter 300 that includes the associated resonators 101 and 102. It is to be noted that the same curve 90 would be obtained if the noise shaping by the resonator 101 were to correspond to the curve 82, and the noise shaping by the resonator 102 were then to correspond to the curve 81. This would simply correspond to an inversion of the position of the respective poles of the transfer functions H1(z) and H2(z) with respect to the frequency Fs/4.

This setting makes it possible to enlarge the frequency band outside of which the energy density N of the quantization noise is rejected. Thus, a satisfactory SNR can be obtained in a larger band than with an Fs/4 mode or Fs/8 mode operation.

The analog-to-digital converter 103 is preferably of the Flash type with n output bits. Such a converter has the advantage of a high conversion speed owing to the absence of transient states.

In addition, the digital-to-analog converter 104 is preferably also of the Flash type, with n input bits, and based on weighted current sources. The advantage of such a converter arises, in this case, too, from the speed of conversion.

Figure 10:
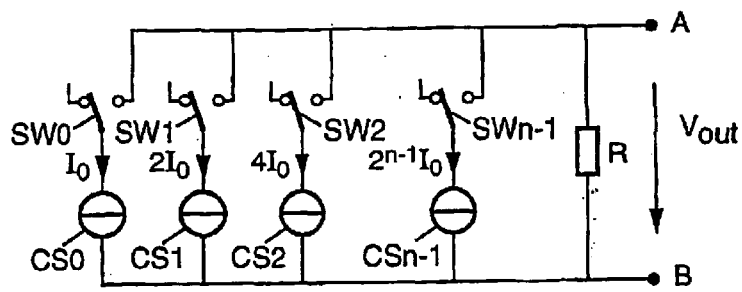
FIG. 10 is a diagram illustrating the principle of a DAC with weighted current sources.

The principle of a DAC with weighted current sources, which is known per se, is illustrated by the diagram of FIG. 10. The DAC includes n current sources CS0 to CSn−1 connected in parallel between a node A and a node B, and each in series with a control switch, SW0 to SWn−1 respectively. The current sources CS0, CS1, ..., CSi, ..., CSn−1 are referred to as "weighted" in the sense that they deliver a current Io, 2×Io, . . . , $2^i$×Io, . . . , $2^{n-1}$×Io respectively where Io is the current delivered by an individual current source. A resistance R is also connected between the nodes A and B. The control switches are controlled by n respective control signals, the logical state of each being determined by the information bits stored in a register (not represented) and corresponding to the digital value to be converted. The voltage Vout between the nodes A and B forms the analog signal produced by the conversion.

In practice, the current sources SC0 to SCn−1 are realized by $2^n$ individual current sources each delivering the above-mentioned current Io, and one of which is not used. The current source CS0 comprises such an individual current source. The current source CS1 comprises two of them in parallel. The current source CS2 comprises four of them in parallel. The current CS3 comprises eight of them in parallel. And so on. According to one advantageous embodiment, each of the $2^n$ individual current sources is made up of $2^n$ individual sub-current sources, each delivering a current Io/$2^n$. Therefore there is a total of $2^n \times 2^n$ current sources included in such a DAC. Typically, these would be respective bipolar transistors.

These current sources are preferably arranged on a silicon substrate according to a determined $2^n \times 2^n$ matrix type geographic distribution, with pseudo-random interleaving.

Said determined geographic distribution, which results in a particular layout in the silicon substrate, has the effect of reducing errors due to variations in currents supplied by each current source as a result of imperfections in the fabrication process (which errors are called "matching errors" of the current sources). To this end, provision is made to have the maximum possible distance between the respective implantation regions of the $2^i$ individual current sources of each determined sub-current source SCi where i is between 0 and n−1, and to have the maximum possible distance between the respective implantation regions of each individual sub-current source of a determined individual current source.

Figures 11, 15:
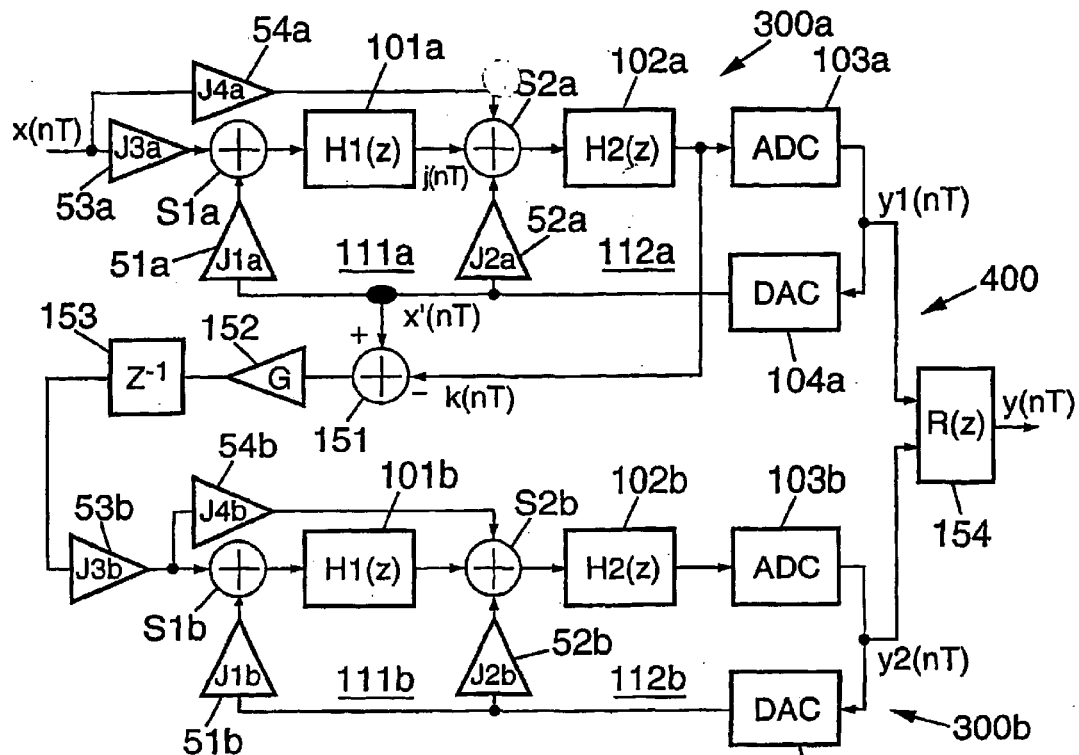
FIG. 11 is a diagram illustrating the geographic distribution on a silicon substrate of 16×16 current sources included in the composition of a DAC with 4 bits as inputs.
FIG. 15 is a diagram of a MASH Sigma-Delta converter according to the invention.

The diagram of FIG. 11 shows an example of such a geographic distribution of current sources. In this figure, the example of a converter with four input bits (n=4) is considered. The references of the form "i−1.j−1" denote the implantation region (in this case approximately a rectangle) on the silicon substrate, of the j-th individual sub-current source of the i-th individual current source, where i and j are between 0 and 15.

The advantage brought about by such a geographic distribution resides in the low Integral Non-Linearity Error (INL), which results in a reduction in spurious lines present in the spectrum of the analog signal at the output of the DAC.

Further, the pseudo-random interleaving (or intermixing) of the current sources also has the effect of rejecting some of the energy of these spurious lines outside of the passband. This aim is achieved by periodically modifying the control bit of a current source by another control bit (these control bits being binary data stored in the abovementioned register). The changes are made by following a pseudo-random law of length L. Of course, the periodicity of these modifications is the source of spurious lines in the spectrum of the analog signal at the output of the DAC, but the value of L is chosen such that these lines are located outside the passband.

The table of FIG. 12 illustrates the principle of this interleaving, still based on the example of a converter with four input bits (n=4), and for a periodicity equal to four (L=4). In this figure, the references C0 to C15 are used to denote the control signals of the sixteen individual current sources, and In0 to In15 are used to denote the binary input values of the DAC. The leftmost column contains the values In0 to In15 assigned to the signals C0 to C15 at instant t=to. The second column from the left contains the values In0 to In15 assigned to the signals C0 to C15 at instant t=to +Ts, where Ts denotes the sampling period (Ts=1/Fs). The third column from the left contains the values In0 to In15 assigned to the signals C0 to C15 at instant t=to +2×Ts. Lastly, the fourth column from the left contains the values In0 to In15 assigned to the signals C0 to C15 at instant t=to+3×Ts.

Figure 13:
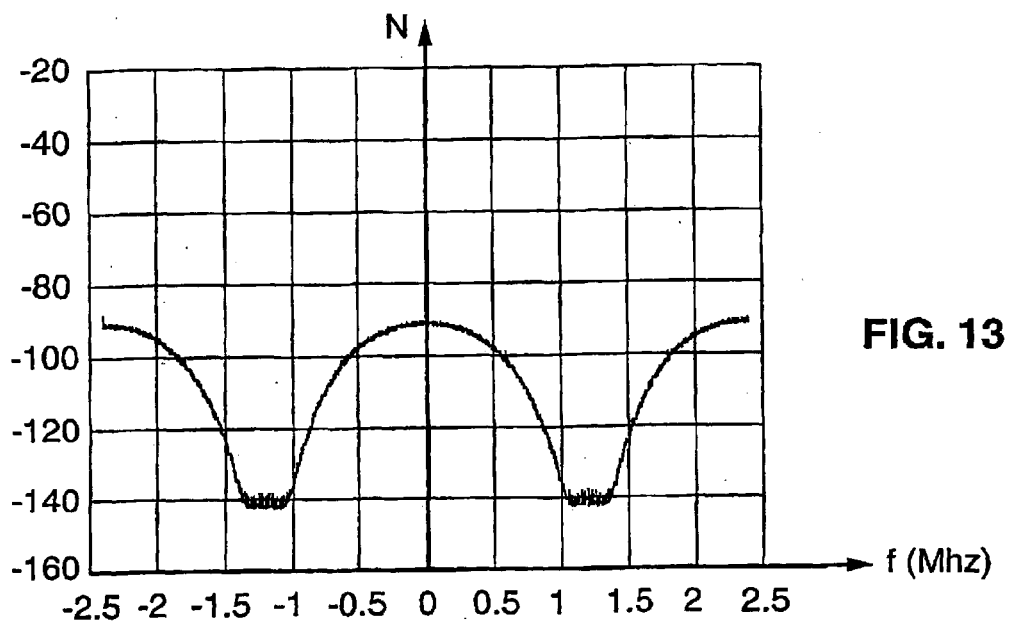
FIG. 13 and FIG. 14 are graphs illustrating the noise shaping, obtained by simulation respectively with and without pseudo-random interleaving of the individual current sources of the DAC.
Figure 14:
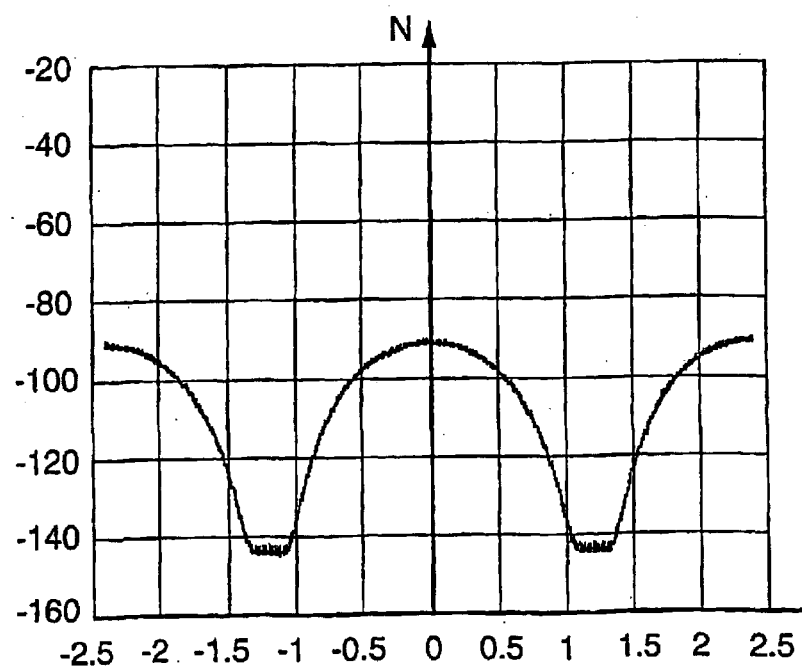

The graphs of FIGS. 13 and 14 show the noise shaping curve obtained by simulation software, respectively with and without interleaving of current sources. As can be seen, the quantization noise is more strongly rejected outside the passband (approximately 200 kHz centered on 1.2 MHz) owing to the interleaving. The improvement in SNR in the passband, as a result of this interleaving, is around 2.3 dB (decibel).

A converter produced according to the present invention can be used to produce a radiofrequency receive system capable of complying with most of the current standards (GSM, TETRAPOL, APCO 25, etc.) that govern radiocommunication systems.

FIG. 15 shows a diagram of a MASH Sigma-Delta analog-to-digital converter according to the invention.

The MASH type structure, or cascaded structure, enables the order of the Sigma-Delta converter to be increased without bringing about stability problems. With two cascaded fourth-order Sigma-Delta converters, the result is an eighth-order MASH type Sigma-Delta analog-to-digital converter. Of course, it is possible to further increase the number of fourth-order Sigma-Delta converters cascaded in this way, in order to obtain a higher order (multiple of four) MASH type Sigma-Delta analog-to-digital converter. However, in practice an eighth-order converter is sufficient for most applications.

Figure 5:
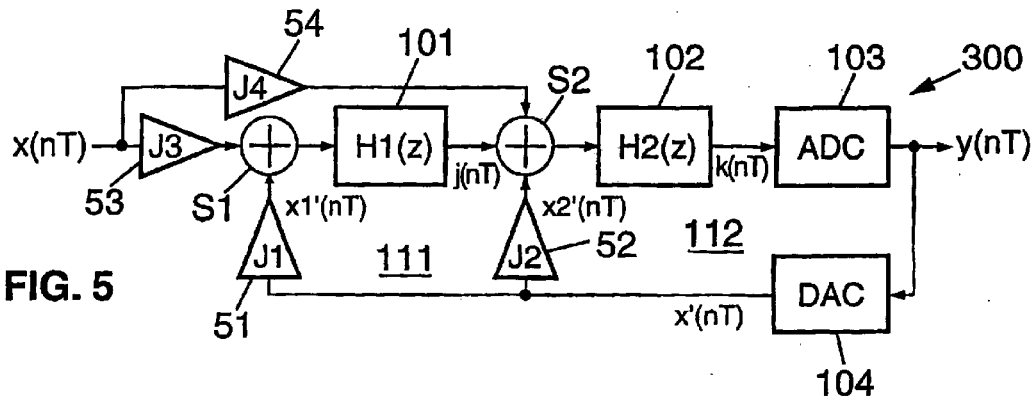
FIG. 5 is a the diagram of a Sigma-Delta converter according to the invention.

In the example represented in FIG. 15, the MASH Sigma-Delta converter 400 comprises two cascaded stages 300$a$ and 300$b$, each of these stages being a fourth-order bandpass Sigma-Delta analog-to-digital converter, as described above with reference to the diagram of FIG. 5. In FIG. 15, the same items as in FIG. 5 bear the same references, but with the addition of the suffix "a" or the suffix "b" for the items of the first stage 300$a$ and for the items of the second stage 300$b$, respectively. The first stage 300$a$ delivers at its output digital values y1(nT) of an output signal y1. Likewise, the second stage 300$b$ delivers at its output digital values y2(nT) of an output signal y2.

The structure of each stage is not described again here. It is to be noted only that the scaling circuit 54$b$ of the second stage 300$b$ does not directly receive the input signal of the second stage 300$b$, but this input signal multiplied by the gain J3$b$ of the scaling circuit 53$b$. The result of this is that the value of the gain J3$b$+J4$b$ of the circuit 53$b$ and of the circuit 54$b$ placed in series corresponds to the value of the gain J4 of the scaling circuit 54 of the converter 300 in FIG. 5.

To provide the link between the two stages 300$a$ and 300$b$, the converter 400 additionally includes an analog subtractor 151, the positive input of which receives the samples x'a(nT) of the analog signal delivered by the output of the DAC 104$a$ of the first stage 300$a$, and the negative input of which receives the samples ka(nT) of the bandpass filtered analog signal ka of the first stage 300a. The output of the subtractor 151 delivers samples of an analog signal corresponding to the difference between the samples x'a(nT) and samples ka(nT). This analog signal, after passing through a scaling circuit 152 and through a delay block 153, forms the analog input signal of the second stage 300b.

The converter 400 additionally includes a recombination filter 154 which receives, at a first input, the output signal y1 of the converter 300a and, at a second input, the output signal y2 of the converter 300b. This filter 154 combines the values y1(nT) and the values y2(nT) of the digital signals y1 and y2 respectively, in order to produce the values y(nT) of the digital output signal y of the converter 400.

In one example, the transfer function R(z) of the recombination filter 154 is given by the following relationship:

$$R(z) = (z^{-3} \times y1) + \frac{1 + 2 \cdot z^{-1} + z^{-2}}{G} \times y2 \qquad (5)$$

where z denotes the discrete-time frequency variable, where y1 denotes the output signal of said first converter (300a), where y2 denotes the output signal of said second converter (300b), and
where G denotes the gain of the scaling circuit 152 placed between the converter 300a and the converter 300b.

What is claimed is:

1. A bandpass Sigma-Delta analog-to-digital converter including:
   a first analog adder having an output, a first input receiving samples of an analog input signal to be converted and a second input receiving samples of a first analog feedback signal;
   a first second-order resonator, the center frequency of which is adjustable, and having an output and an input receiving samples delivered by said output of said first analog adder;
   a second analog adder having an output, a first input receiving samples delivered by said output of said first resonator, a second input receiving samples of a second analog feedback signal, and third output receiving samples of said analog input signal to be converted;
   a second second-order resonator, the center frequency of which is adjustable, having an output and an input receiving the samples delivered by said output of the second analog adder;
   an analog-to-digital converter having an input receiving samples delivered by the output of the second resonator and an output delivering values of a digital output signal corresponding to the converted analog input signal;
   a first feedback loop that includes a digital-to-analog converter having an input receiving values of said digital output signal, and an output delivering said samples of said first analog feedback signal;
   a second feedback loop that includes said digital-to-analog converter and comprises an output delivering said samples of said second analog feedback signal,
   wherein the first resonator has a transfer function H1(z) given by the following relationship:

$H1(z)=[(\cos \theta1 \times z^{-1})-z^{-2}]/[(1-(2\times(\cos \theta z^{-1})+z^{-2}]$ and/or wherein the second resonator has a transfer function H2(z) given by the following relationship:

$H2(z)=[(\cos \theta2 \times z^{-1})-z^{-2}(1-(2\times(\cos \theta2 \times z^{-1})+z^{-2}]$ where z denotes the discrete-time frequency variable,
   and where θ1 and θ2 denote the argument of the variable z for the transfer function H1(z) and for the transfer function H2(z), respectively,
   and wherein the central frequency of the first resonator and/or the central frequency of the second resonator are adjustable via parameter cos θ1 and/or parameter cos θ2, respectively.

2. The converter of claim 1, wherein the first resonator and the second resonator are of identical structure.

3. The converter of claim 1, wherein the first resonator and/or the second resonator have a switched-capacitor structure, with adjustment of the parameter cos θ1 and/or cos θ2, respectively, via a respective variable capacitor.

4. The converter of claim 1, wherein the sampling frequency is approximately equal to four times the center frequency of the frequency band of the analog input signal to be converted.

5. The converter of claim 1, wherein the center frequency of the first resonator is slightly less than or greater than the center frequency of the frequency band of the analog input signal to be converted, and the center frequency of the second resonator is respectively slightly greater that or slightly less than the center frequency of the frequency band of the analog input signal to be converted.

6. The converter of claim 1, wherein the analog-to-digital converter is of the Flash type with a given number n of output bits, where n is an integer strictly greater than one.

7. The converter of claim 1, wherein the digital-to-analog converter is of the Flash type with a given number n of input bits, where n is a strictly positive integer, and with weighted current sources.

8. The converter of claim 7, wherein the current sources are produced on a silicon substrate according to a $2^n \times 2^n$ matrix type geographic distribution, with pseudo-random interleaving.

9. A MASH type Sigma-Delta analog-to-digital converter, including at least a first and a second bandpass Sigma-Delta analog-to-digital converter that are cascaded, and a recombination filter having a first input receiving the output signal of said first converter and a second input receiving the output signal of said second converter wherein said first and/or said second converters are converters as claimed in any one of the preceding claims.

10. The converter of claim 9, wherein the transfer function R(z) of the recombination filter is given by the following relationship:

$R(z)=(x^{-3} \times y1)+[(1+2z^{-1}+z^{-2})/G) \times y2]$ where z denotes the discrete-time frequency variable,
where y1 denoted the output signal of the first converter,
where y2 denotes the output signal of the second converter, and
where G denotes the gain of a scaling circuit placed between the first converter and the second converter.

* * * * *